United States Patent
Yeh et al.

(10) Patent No.: US 11,522,067 B2
(45) Date of Patent: Dec. 6, 2022

(54) HIGH ELECTRON MOBILITY TRANSISTOR (HEMT) DEVICE AND METHOD OF FORMING SAME

(71) Applicant: Taiwan Semiconductor Manufacturing Co., Ltd., Hsinchu (TW)

(72) Inventors: Chia-Ling Yeh, Jhubei (TW); Ching Yu Chen, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/225,482

(22) Filed: Apr. 8, 2021

(65) Prior Publication Data

US 2021/0226040 A1  Jul. 22, 2021

Related U.S. Application Data

(62) Division of application No. 16/414,879, filed on May 17, 2019, now Pat. No. 11,011,614.

(Continued)

(51) Int. Cl.
*H01L 29/66* (2006.01)
*H01L 29/20* (2006.01)
(Continued)

(52) U.S. Cl.
CPC .... *H01L 29/66462* (2013.01); *H01L 21/0254* (2013.01); *H01L 21/76897* (2013.01);
(Continued)

(58) Field of Classification Search
CPC .......... H01L 29/66462; H01L 29/2003; H01L 29/205; H01L 21/76897; H01L 23/3171;
(Continued)

(56) References Cited

U.S. PATENT DOCUMENTS

2006/0226442 A1* 10/2006 Zhang ................. H01L 29/7787
257/E29.253
2011/0227093 A1   9/2011 Hikita et al.
(Continued)

FOREIGN PATENT DOCUMENTS

JP   2010135641 A   6/2010

OTHER PUBLICATIONS

Chiu, H.C. et al., "High-Performance Normally Off p-GaN Gate HEMT With Composite AlN/Al0.17Ga0.83N/Al0.3 Ga0.7N Barrier Layers Design," Journal of the Electron Devices Society, Jan. 2018, vol. 6, pp. 201-206.
(Continued)

*Primary Examiner* — Edward Chin
(74) *Attorney, Agent, or Firm* — Slater Matsil, LLP

(57) ABSTRACT

A high electron mobility transistor (HEMT) device and a method of forming the same are provided. The method includes forming a first III-V compound layer over a substrate. A second III-V compound layer is formed over the first III-V compound layer. The second III-V compound layer has a greater band gap than the first III-V compound layer. A third III-V compound layer is formed over the second III-V compound layer. The third III-V compound layer and the first III-V compound layer comprise a same III-V compound. A passivation layer is formed along a topmost surface and sidewalls of the third III-V compound layer. A fourth III-V compound layer is formed over the second III-V compound layer. The fourth III-V compound layer has a greater band gap than the first III-V compound layer.

20 Claims, 18 Drawing Sheets

Related U.S. Application Data

(60) Provisional application No. 62/691,937, filed on Jun. 29, 2018.

(51) Int. Cl.

| | | |
|---|---|---|
| *H01L 29/205* | (2006.01) | |
| *H01L 21/768* | (2006.01) | |
| *H01L 23/31* | (2006.01) | |
| *H01L 21/02* | (2006.01) | |
| *H01L 29/778* | (2006.01) | |

(52) U.S. Cl.
CPC ...... *H01L 23/3171* (2013.01); *H01L 29/2003* (2013.01); *H01L 29/205* (2013.01); *H01L 29/7786* (2013.01)

(58) Field of Classification Search
CPC ............. H01L 21/0254; H01L 29/7786; H01L 21/02505; H01L 21/02458; H01L 21/02579; H01L 21/0262; H01L 21/02581; H01L 23/3192; H01L 29/1066; H01L 29/41766; H01L 29/778; H01L 29/66431

See application file for complete search history.

(56) References Cited

U.S. PATENT DOCUMENTS

2014/0191240 A1* 7/2014 Chiang ............... H01L 21/2654
438/285
2020/0220004 A1* 7/2020 Radosavljevic .... H01L 29/7786

OTHER PUBLICATIONS

Suh C.S. et al., "p-GaN/AlGaN/GaN Enhancement-Mode HEMTs", 64th Device Research Conference, Jun. 26-28, 2006, 3 pages.
Yang Yibin et al., "Effect of Compositionally Graded AlGaN Buffer Layer Grown by Different Functions of Trimethylaluminum Flow Rates on the Properties of GaN on Si (111) Substrates," Elsevier, Journal of Crystal Growth 376, 2013, pp. 23-27.

* cited by examiner

HIGH ELECTRON MOBILITY TRANSISTOR (HEMT) DEVICE AND METHOD OF FORMING SAME

CROSS-REFERENCE TO RELATED APPLICATIONS

This application is a division of U.S. patent application Ser. No. 16/414,879, filed on May 17, 2019, which claims the benefit of U.S. Provisional Application No. 62/691,937, filed on Jun. 29, 2018, which applications are hereby incorporated herein by reference.

BACKGROUND

In semiconductor technology, due to the high mobility values, Group III-Group V (or III-V) semiconductor compounds are used to form various integrated circuit devices, such as high power field-effect transistors, high frequency transistors, and High Electron Mobility Transistors (HEMTs). A HEMT is a field effect transistor incorporating a 2-Dimensional Electron Gas (2DEG) layer or a Two-Dimensional Hole Gas (2DHG) layer close to the junction between two materials with different band gaps (referred to as a heterojunction). The 2DEG layer, instead of a doped region as is generally the case for Metal Oxide Semiconductor Field Effect Transistors (MOSFETs), acts as the channel. In contrast with the MOSFETs, the HEMTs have a number of attractive properties including high electron mobility, the ability to transmit signals at high frequencies, and the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
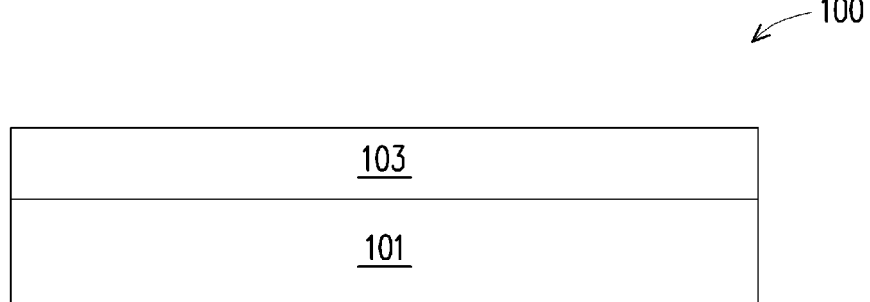
FIGS. 1-5, 6A, 6B, and 7-18 illustrate cross-sectional views of various intermediary steps of forming a HEMT device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments are directed to a semiconductor device, such as a high electron mobility transistor (HEMT) device, and a method of forming the same. The HEMT device includes a multi-barrier layer structure having different polarizations, where a portion of a top high polarization barrier layer is removed over a channel region of the HEMT device, which allows for forming the HEMT device having a high threshold voltage ($V_{th}$). The multi-barrier layer structure allows for tuning a carrier (such as, for example, electron or hole) concentration in a channel layer (such as, for example, a two-dimensional electron gas [2DEG] or a two-dimensional hole gas [2DHG]) of the HEMT device and allows for decreasing an on-resistance ($R_{on}$) of the HEMT device. The top high polarization barrier layer also yields a high band gap that reduces carrier trapping and results in a low dynamical on-resistance ($dR_{on}$). The top high polarization barrier layer of the multi-barrier layer structure is formed over an underlying low polarization barrier layer of the multi-barrier layer structure using a low-temperature growth process that reduces a roughness of an interface between the top high polarization barrier layer and the underlying low polarization barrier layer that in turn reduces carrier trapping and results in a low $dR_{on}$.

FIGS. 1 through 18 illustrate cross-sectional views of various intermediary steps of forming a HEMT device 100 in accordance with some embodiments. In the illustrated embodiments, the HEMT device 100 is formed using a gate-last approach, in which a gate electrode is formed after the formation of source/drain electrodes. In alternative embodiments, the HEMT device 100 may also be formed using a gate-first approach, in which a gate electrode is formed before the formation of source/drain electrodes.

Referring to FIG. 1, a cross-sectional view of a portion of substrate 101 is provided. The substrate 101 may be a part of an un-singulated wafer. In some embodiments, the substrate 101 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate 101 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

In some embodiments, a buffer layer 103 is formed over the substrate 101. The buffer layer 103 acts as the buffer and/or the transition layer for the subsequently formed overlying layers. In some embodiments, the buffer layer 103 may comprise a III-V compound, such as aluminum nitride (AlN). In other embodiments, the buffer layer 103 may comprise other III-V compounds, such as aluminum arsenide (AlAs), or the like. In some embodiments, the buffer layer 103 may be epitaxially grown using metal-organic chemical vapor deposition (MOCVD), molecular beam epitaxy (MBE), liquid phase epitaxy (LPE), vapor phase epitaxy (VPE), metal organic vapor phase epitaxy (MOVPE), selective epitaxial growth (SEG), a combination thereof, or the like. The buffer layer 103 may comprise a single layer or a plurality of layers. In some embodiments, the buffer layer 103 has a thickness between about 100 nm and about 2000 nm.

Figure 2:
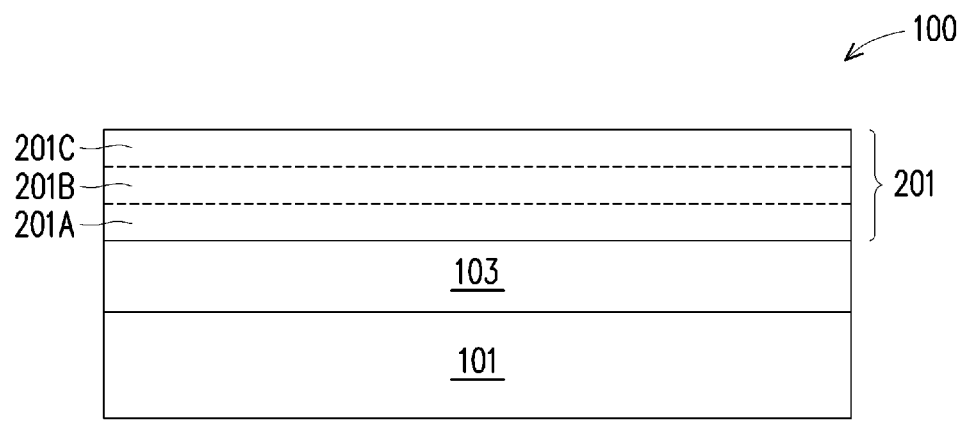

Referring to FIG. 2, a buffer layer 201 is formed over the buffer layer 103. In some embodiments, the buffer layer 201 comprises a III-V compound, such as aluminum gallium nitride (AlGaN), indium aluminum gallium nitride (InAlGaN), or the like. In some embodiments, the buffer layer 201 may be epitaxially grown over the buffer layer 103 using similar methods as the buffer layer 103 described above with reference to FIG. 1, and the description is not repeated herein. In some embodiments, the buffer layer 201 has a thickness between about 100 nm and about 5000 nm. The buffer layer 201 may be a graded buffer layer, which means that the relative amounts of the respective aluminum and/or gallium content change with depth in the layer throughout a part or the total thickness of the buffer layer 201. The relative amounts may change gradually to reduce the lattice parameter with the distance from the substrate 101. For example, FIG. 2 schematically illustrates three sub-layers 201A, 201B, and 201C of the buffer layer 201, with the amounts of aluminum and/or gallium in the sub-layers 201A, 201B, and 201C being different from each other. In an embodiment, the sub-layer 201A comprises $Al_xGa_{1-x}N$, the sub-layer 201B comprises $Al_yGa_{1-y}N$, and the sub-layer 201C comprises $Al_zGa_{1-z}N$, with x being greater than y, and y being greater than z.

Figure 3:
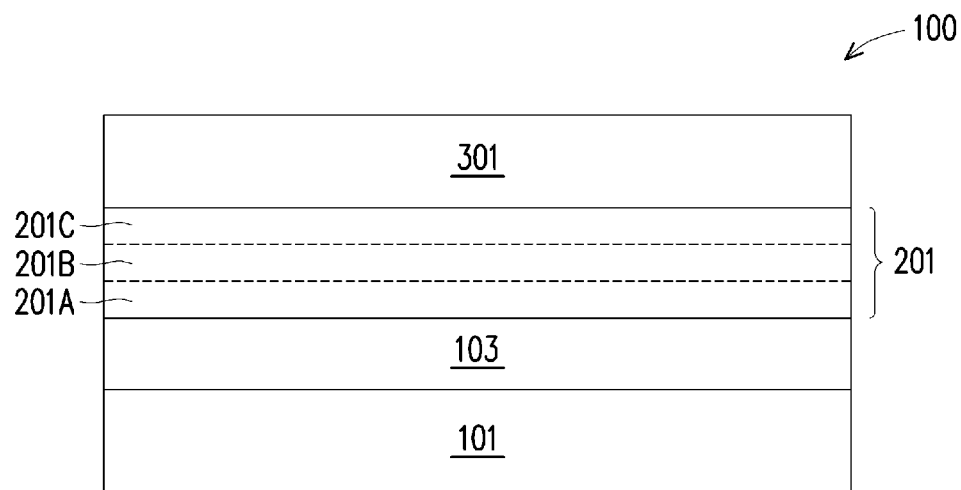

Referring to FIG. 3, a III-V compound layer 301 is formed over the buffer layer 201. In some embodiments, the III-V compound layer 301 comprises gallium nitride (GaN), or the like. In some embodiments, the III-V compound layer 301 may be epitaxially grown over the buffer layer 201 using similar methods as the buffer layer 103 described above with reference to FIG. 1, and the description is not repeated herein. In some embodiments where the III-V compound layer 301 comprises GaN, the III-V compound layer 301 may be epitaxially grown by using, for example, MOVPE, during which a gallium-containing precursor and a nitrogen-containing precursor are used. The gallium-containing precursor may include trimethylgallium (TMG), triethylgallium (TEG), other suitable gallium-containing chemicals, a combination thereof, or the like. The nitrogen-containing precursor may include ammonia ($NH_3$), tertiarybutylamine (TBAm), phenyl hydrazine, other suitable nitrogen-containing chemicals, a combination thereof, or the like. In some embodiments, the III-V compound layer 301 has a thickness between about 200 nm and about 5000 nm.

In some embodiments, the III-V compound layer 301 may be doped using suitable dopants. In some embodiments, where the III-V compound layer 301 comprises GaN, the III-V compound layer 301 may be carbon (C) doped or iron (Fe) doped. In some embodiments, the III-V compound layer 301 may be in situ doped while epitaxially growing the III-V compound layer 301. In such embodiments, the epitaxial growing process may further include a carbon-containing precursor or an iron-containing precursor. The carbon-containing precursor may include methane ($CH_4$), ethylene ($C_2H_4$), acetylene ($C_2H_2$), propane ($C_3H_8$), iso-butane (i-$C_4H_{10}$), trimethylamine [$N(CH_3)_3$], carbon tetrachloride ($CCl_4$), a combination thereof, or the like. The iron-containing precursor may include Bis(cyclopentadienyl)iron [$(C_5H_5)_2Fe$], pentacarbonyl iron [$(CO)_5Fe$], the like. In other embodiments, the III-V compound layer 301 may be doped after the formation of the III-V compound layer 301 is completed. In such embodiments, the III-V compound layer 301 may be doped using an implantation method, or the like. In some embodiments, the III-V compound layer 301 is a semi-insulating layer. In some embodiments, the III-V compound layer 301 improves leakage and breakdown performances of the HEMT device 100.

Figure 4:
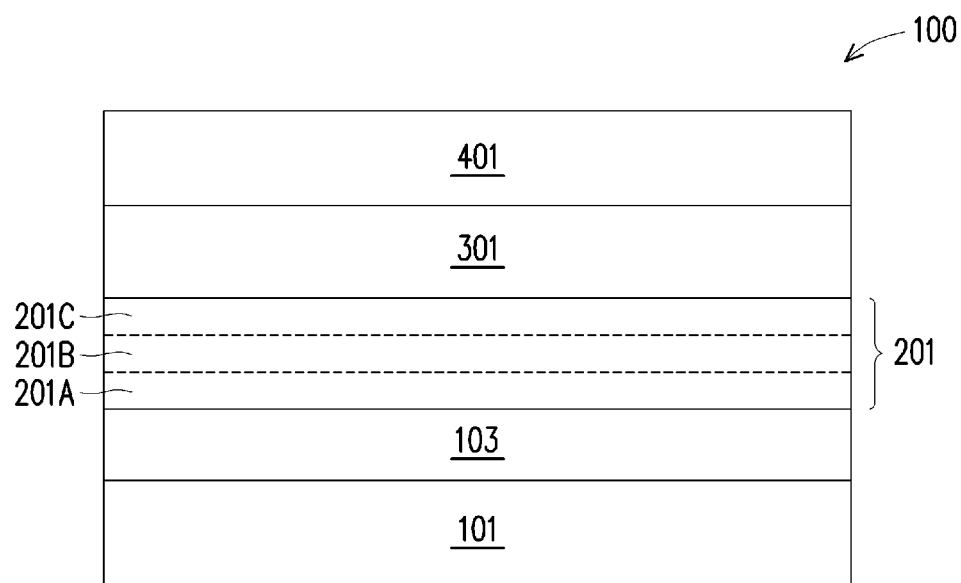

Referring to FIG. 4, a III-V compound layer 401 is formed over the III-V compound layer 301. In some embodiments, the III-V compound layer 401 comprises a III-V compound, such as gallium nitride (GaN), or the like. In some embodiments, the III-V compound layer 401 may be epitaxially grown using similar method as the III-V compound layer 301 described above with reference to FIG. 3, and the description is not repeated herein. In some embodiments, the III-V compound layer 401 has a thickness between about 300 nm and about 3000 nm. The III-V compound layer 401 may be undoped. Alternatively, the III-V compound layer 401 is unintentionally doped, such as lightly doped with n-type (or p-type) dopants due to a precursor used for forming the III-V compound layer 401, with no dopant that may cause the III-V compound layer 401 to be n-type or p-type intentionally added.

Figure 5:
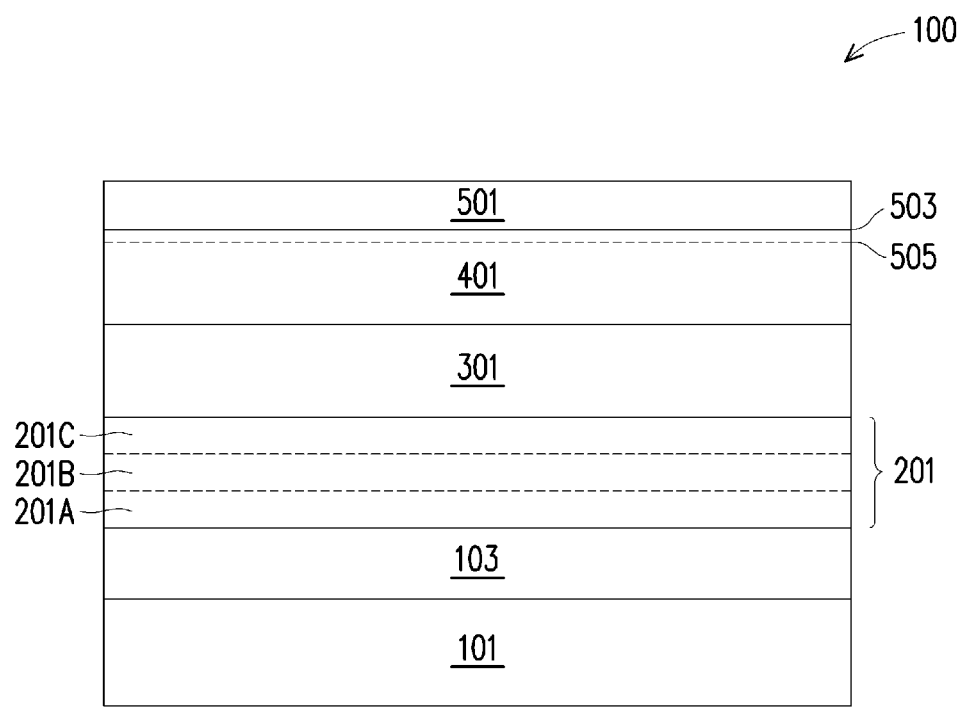

Referring to FIG. 5, a III-V compound layer 501 is formed over the III-V compound layer 401. The III-V compound layer 501 may also referred to as a barrier layer or a polarization layer. In some embodiments, the III-V compound layer 501 has a band gap higher than the band gap of the III-V compound layer 401. In such embodiments, the III-V compound layer 501 generates a quantum well within the III-V compound layer 401 near an interface 503 between the III-V compound layer 501 and III-V compound layer 401. The quantum well traps carriers, such as electrons or holes, and forms a channel layer 505 (shown as a dashed line in FIG. 5), which is known as a two-dimensional electron gas (2DEG) or a two-dimensional hole gas (2DHG), respectively, in the III-V compound layer 401 near the interface 503. In the following description, a thickness of the dashed line of the channel layer illustrates a carrier concentration within the channel layer 505. The channel layer 505 has high electron mobility partly because the III-V compound layer 401 is undoped or unintentionally doped and the carriers (such as, electrons or holes) can move freely without collision or with substantially reduced collisions with impurities (such as, for example, unintentionally introduced dopants).

In some embodiments, the III-V compound layer 501 comprises AlGaN, or the like. In some embodiments, an aluminum content in the III-V compound layer 501 may be altered relative to a gallium content to alter a polarization strength of the III-V compound layer 501. In some embodiment, the aluminum content x in the III-V compound layer 501 formed of $Al_xGa_{1-x}N$ may be between about 0.7 and about 0.6. In some embodiments, the III-V compound layer 501 may be epitaxially grown over the III-V compound layer 401 using MOCVD, MBE, LPE, VPE, MOVPE, SEG, combinations thereof, or the like. In some embodiments where the III-V compound layer 501 comprises AlGaN, the III-V compound layer 501 may be grown by a MOVPE process using an aluminum-containing precursor, a gallium-containing precursor, and a nitrogen-containing precursor. The aluminum-containing precursor may include trimethylaluminum (TMA), triethylaluminium (TEA), other suitable aluminum-containing chemicals, a combination thereof, or the like. The gallium-containing precursor and the nitrogen-containing precursor may be selected from the same candidate precursors used for forming the III-V compound layers 301 and 401 described above with reference to FIGS. 3 and 4, respectively, and the description is not repeated herein. In some embodiments, the III-V compound layer 501 has a thickness between about 10 nm and about 30 nm.

Figure 6A:
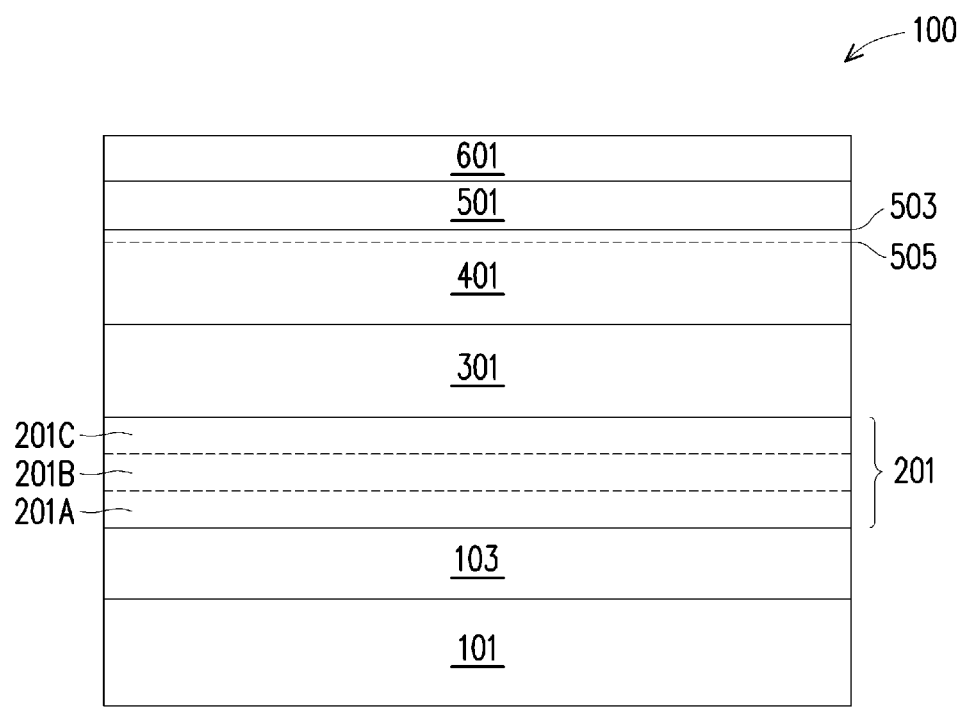

Referring to FIG. 6A, a III-V compound layer 601 is formed over the III-V compound layer 501. In some embodiments, the III-V compound layer 601 may comprise GaN, p-doped aluminum gallium nitride (p-AlGaN), or the like. In some embodiments, the III-V compound layer 601 may be formed using similar methods as the III-V compound layers 301 and 401, described above with reference to FIGS. 3 and 4, respectively, and the description is not repeated herein. In some embodiments where the III-V compound layer 601 comprises GaN, the III-V compound layer 601 may be epitaxially grown by using, for example, MOVPE, during which a gallium-containing precursor and a nitrogen-containing precursor are used. The gallium-containing precursor and the nitrogen-containing precursor may be selected from the same candidate precursors used for forming the III-V compound layers 301 and 401 described above with reference to FIGS. 3 and 4, respectively, and the description is not repeated herein.

In some embodiments, the III-V compound layer 601 is p-doped. In some embodiments where the III-V compound layer 601 comprises GaN, the III-V compound layer 601 may be p-doped using magnesium (Mg), zinc (Zn), a combination thereof, or the like. In some embodiments, the III-V compound layer 601 may be in situ doped while epitaxially growing the III-V compound layer 601. In such embodiments, the MOVPE process may further include a magnesium-containing precursor, a zinc-containing precursor, or a combination thereof. The magnesium-containing precursor may include bis-cyclopentadienyl magnesium ($Cp_2Mg$), bis-methylcyclopentadienyl magnesium [$(MeCp)_2Mg$], bisethylcyclopentadienyl magnesium ($ECp_2Mg$), a combination thereof, or the like. The zinc-containing precursor may include diethylzinc (DEZn), or the like. In other embodiments, the III-V compound layer 601 may be doped after the formation of the III-V compound layer 601 is completed. In such embodiments, the III-V compound layer 601 may be doped using an implantation method, or the like. In some embodiments, an annealing process may be performed to activate the dopants. In some embodiments, the III-V compound layer 601 has a thickness between about 10 nm and about 500 nm.

Figure 6B:
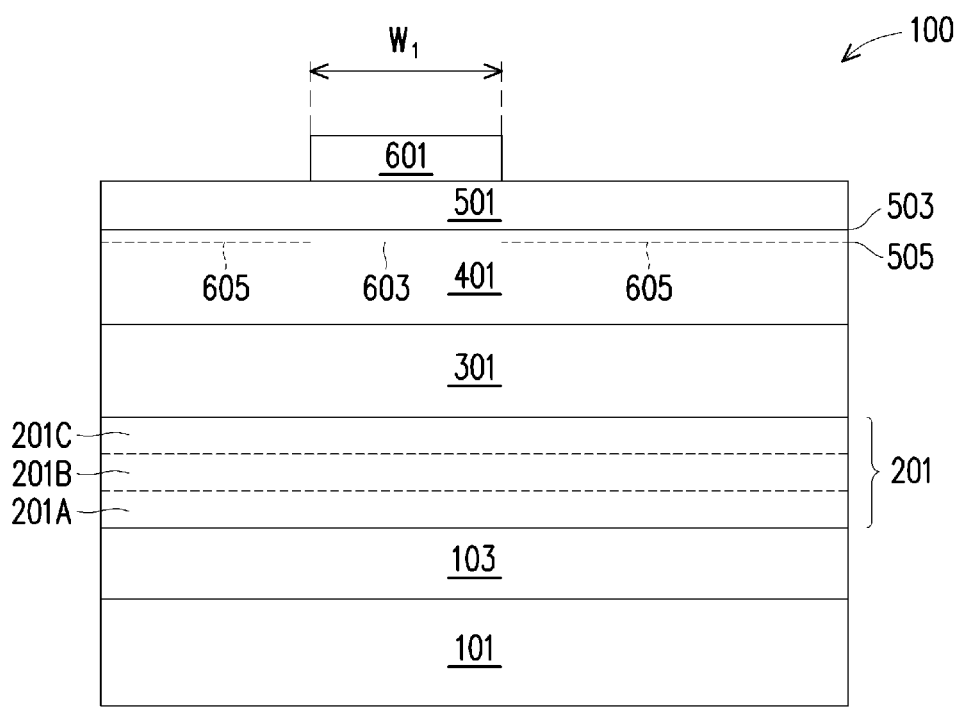

Referring to FIG. 6B, the III-V compound layer 601 is patterned to remove portions of the III-V compound layer 601 over the III-V compound layer 501. In some embodiments, the III-V compound layer 601 may be patterned using suitable photolithography and etching methods. In some embodiments, the patterned III-V compound layer 601 has a width $W_1$ between about 1 μm and about 20 μm. In some embodiments, the patterned III-V compound layer 601 depletes carriers in a channel region 603 of the channel layer 505 (illustrated by absence of the dashed line in the channel region 603 of the channel layer 505) that is located directly below the patterned III-V compound layer 601. Portions of the channel layer 505 on either side of the channel region 603 may form access regions 605, which may also referred to as sourced/drain regions 605. In such embodiments, the channel layer 505 has a non-uniform carrier concentration, with the carriers having a higher concentration in the access regions 605 than in the channel region 603. As described below in greater detail, a gate electrode is formed over the patterned III-V compound layer 601 that allows for tuning the carrier concentration in the channel region 603 of the channel layer 505. Accordingly, the patterned III-V compound layer 601 may be a part of a gate structure formed over the channel region 603 of the channel layer 505. In some embodiments, by forming the III-V compound layer 601 over the III-V compound layer 501 that depletes carriers in the channel region 603 of the channel layer 505, a threshold voltage ($V_{th}$) of the HEMT device 100 may be increased.

Figure 7:
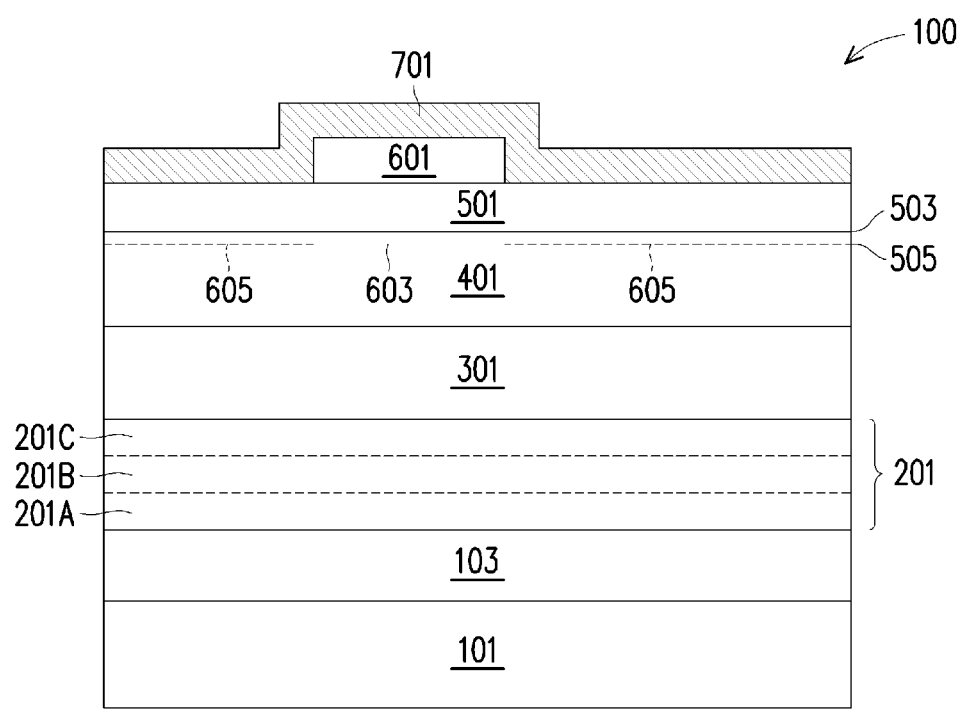

Referring to FIG. 7, a passivation layer 701 is formed over the III-V compound layers 501 and 601. In some embodiments, the passivation layer 701 may comprise silicon oxide, silicon nitride, silicon oxynitride, a combination thereof, or the like, and may be formed using chemical vapor deposition (CVD), atomic layer deposition (ALD), a combination thereof, or the like. In some embodiments, the passivation layer 701 may have a thickness between about 1 μm and about 10 μm.

Figure 8:
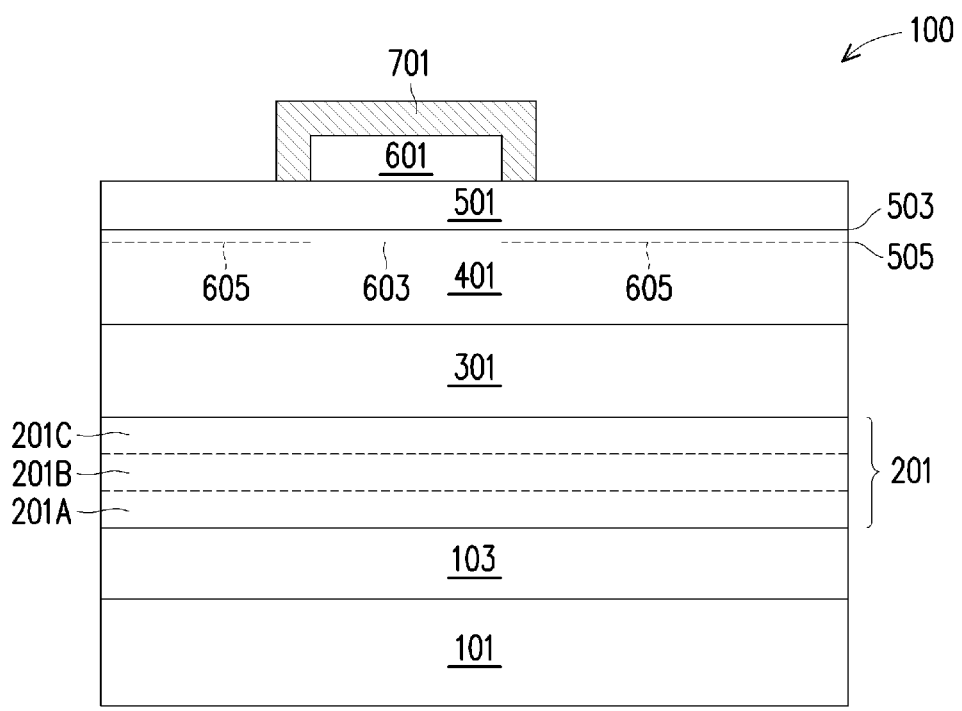

Referring to FIG. 8, the passivation layer 701 is patterned to expose portions of the III-V compound layer 501 not covered by the III-V compound layer 601. Furthermore, the passivation layer 701 is patterned such that a remaining portion of the passivation layer 701 covers a top surface and sidewall of the III-V compound layer 601. In some embodiments, the remaining portion of the passivation layer 701 protects the III-V compound layer 601 from subsequent process steps. In some embodiments, the passivation layer 701 is patterned using suitable photolithography and etching methods.

Figure 9:
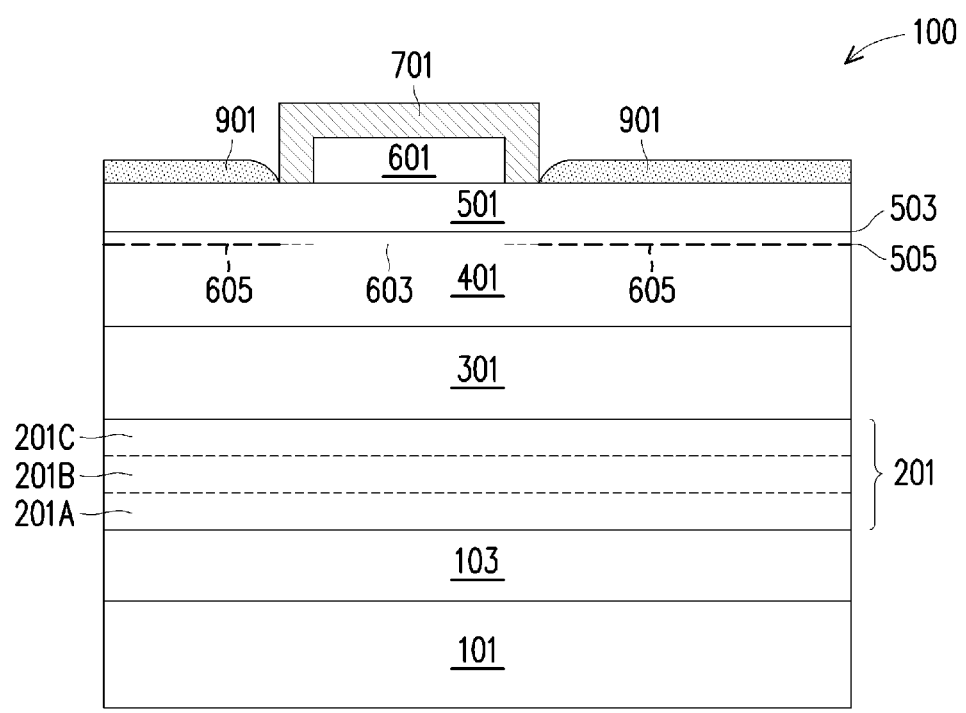

Referring to FIG. 9, a III-V compound layer 901 is formed over the exposed portions of the III-V compound layer 501 on either side of the III-V compound layer 601. In some embodiments, the III-V compound layer 901 has a band gap higher than the band gap of the III-V compound layer 401. The III-V compound layer 901 may also be referred to as a barrier layer or a polarization layer. In some embodiments, the III-V compound layer 901 may comprise AlGaN, or the like. In some embodiments, an aluminum content in the III-V compound layer 901 may be altered relative to a gallium content to alter a polarization strength of the III-V compound layer 901. In some embodiments, the III-V compound layer 901 may have a greater aluminum content than the III-V compound layer 501. In such embodiments, the III-V compound layer 901 has a higher polarization strength than the III-V compound layer 501. In some embodiment, the aluminum content y in the III-V compound layer 901 formed of $Al_yGa_{1-y}N$ may be between about 0.7 and about 0.6. In some embodiment, a ratio of the aluminum content y in the III-V compound layer 901 formed of $Al_yGa_{1-y}N$ over the aluminum content x in the III-V compound layer 501 formed of $Al_xGa_{1-x}N$ is between about 1.1 and about 2.5.

In some embodiments, by forming the III-V compound layer 901 over the III-V compound layer 501, the carrier concentration in the channel layer 505 is further altered. In some embodiments, the carrier concentration in the channel layer 505 is altered such that the carrier concentration in the access regions 605 of the channel layer 505 directly below the III-V compound layer 901 is greater than the carrier concentration in the access regions 605 of the channel layer 505 directly below the passivation layer 701. By increasing the carrier concentration in the access regions 605 of the channel layer 505, an on-resistance ($dR_{on}$) of the HEMT device 100 is lowered.

The III-V compound layers 501 and 901 form a multi-barrier layer structure over the III-V compound layer 401. In the illustrated embodiment, the multi-barrier layer structure comprises two layers (such as the III-V compound layers 501 and 901). In other embodiments, the multi-barrier layer structure may comprise more than two layers according to design specifications of the HEMT device 100. By not forming the III-V compound layer 901 over the channel region 603 of the channel layer 505, low carrier concentration in the channel region 603 is achieved, which results in the high threshold voltage ($V_{th}$). In some embodiments, the threshold voltage ($V_{th}$) is between about −6 V and about +6 V.

Referring further to FIG. 9, the III-V compound layer 901 is epitaxially grown over the III-V compound layer 501 using MOCVD, MBE, LPE, VPE, MOVPE, SEG, combinations thereof, or the like. In some embodiments, the III-V compound layer 901 is selectively grown over the exposed portions of the III-V compound layer 501, such that no portion of the III-V compound layer 901 is formed over the passivation layer 701. In some embodiments where the III-V compound layer 901 comprises AlGaN, the III-V compound layer 901 may be epitaxially grown using an aluminum-containing precursor, a gallium-containing precursor, and a nitrogen-containing precursor. The aluminum-containing precursor, the gallium-containing precursor and the nitrogen-containing precursor may be selected from the same candidate precursors used for forming the III-V compound layer 501 described above with reference to FIG. 5, and the description is not repeated herein. In some embodiments, the III-V compound layer 901 has a thickness between about 1 nm and about 50 nm.

In some embodiments where the III-V compound layer 901 comprises AlGaN, a method of forming the III-V compound layer 901 includes introducing the substrate 101 with the passivation layer 701 and the III-V compound layers 501 and 601 formed thereon in a process chamber and ramping up a process temperature to a target temperature before introducing the aluminum-containing precursor, the gallium-containing precursor, and the nitrogen-containing precursor into the process chamber. In some embodiments, the process temperature is ramped up to the target temperature during a first time interval between about 1 min and about 300 min. In some embodiments, the target temperature is between about 700° C. and about 1100° C. By tuning the target temperature to be less than about 816° C., decomposition of the exposed portions of the III-V compound layer 501 may be reduced or avoided. Furthermore, a root-mean-square roughness of a topmost surface of the III-V compound layer 501 is not substantially increased. Accordingly, after forming the III-V compound layer 901 over the III-V compound layer 501, a well-defined smooth interface is formed between the III-V compound layer 901 and the III-V compound layer 501. By forming the well-defined smooth interface between the III-V compound layers 901 and 501, carrier trapping may be avoided at the interface that results in a low dynamical on-resistance ($dR_{on}$) of the HEMT device 100. In some embodiment, a root-mean-square (RMS) roughness of the interface between the III-V compound layers 901 and 501 is between about 0.5 nm and about 10 nm.

In some embodiments, after process temperature reaches the target temperature, the aluminum-containing precursor, the gallium-containing precursor, and the nitrogen-containing precursor are introduced in the process chamber. In some embodiments, a flow rate of the aluminum-containing precursor is between about 10 sccm and about 1000 sccm. In some embodiments, a flow rate of the gallium-containing precursor is between about 10 sccm and about 1000 sccm. In some embodiments, a flow rate of the nitrogen-containing precursor is between about 100 sccm and about 100000 sccm. In some embodiments, the aluminum-containing precursor, the gallium-containing precursor, and the nitrogen-containing precursor are flown into the process chamber during a growth time between about 1 s and about 387 s. In some embodiments, the growth time is tuned until a desired thickness of the III-V compound layer 901 is achieved.

Figure 10:
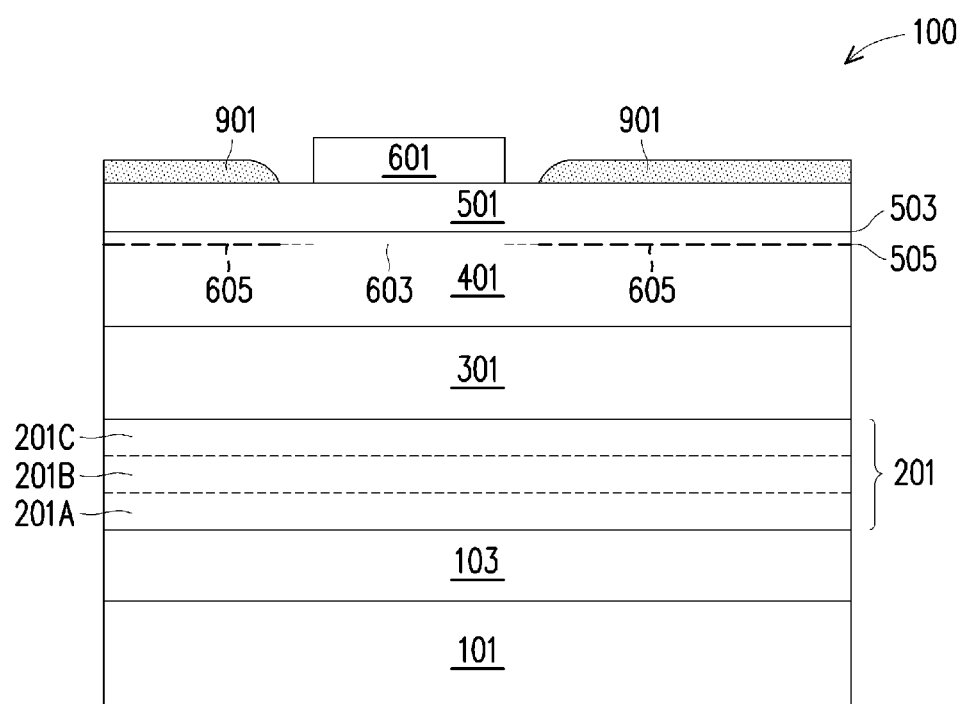

Referring to FIG. 10, after the formation of the III-V compound layer 901 is completed, the passivation layer 701 is removed. In some embodiments, the passivation layer 701 is removed using a selective wet etching process, a selective dry etching process, a combination thereof, or the like. After removing the passivation layer 701, a portion of the topmost surface of the III-V compound layer 501 is exposed between the III-V compound layer 601 and the III-V compound layer 901.

Figure 11:
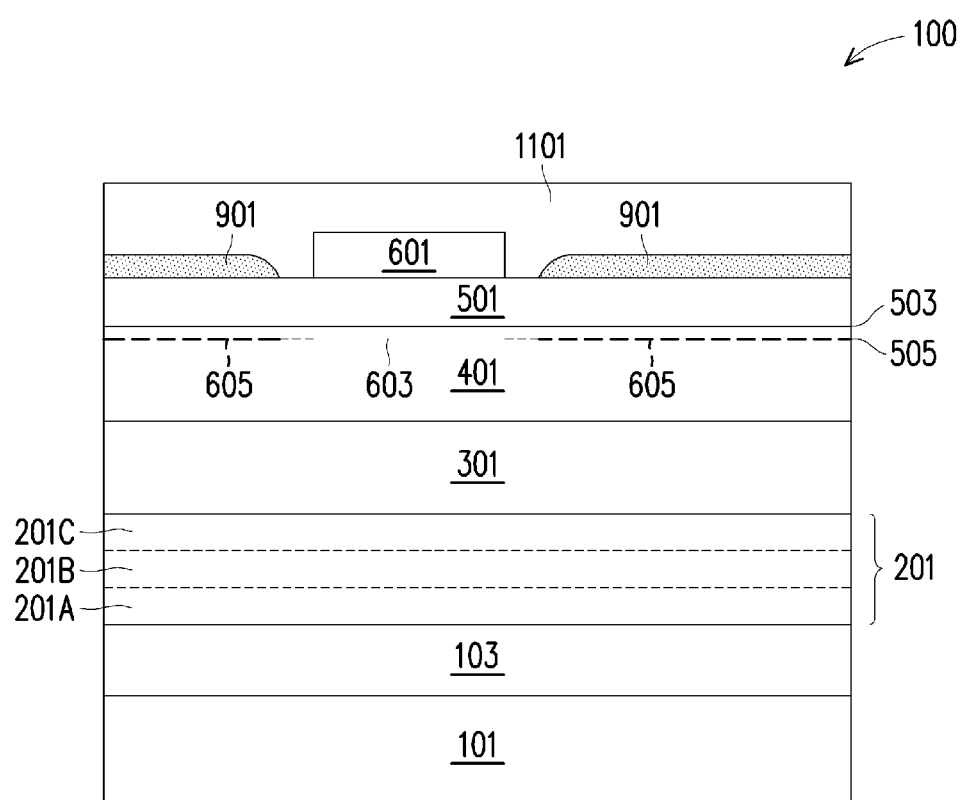

Referring to FIG. 11, a passivation layer 1101 is formed over the III-V compound layers 501, 601 and 901. In some embodiments, the passivation layer 1101 may be formed using similar materials and methods as the passivation layer 701 described above with reference to FIG. 7, and the description is not repeated herein. In some embodiments, the passivation layer 1101 has a thickness between about 1 μm and about 20 μm.

Figure 12:
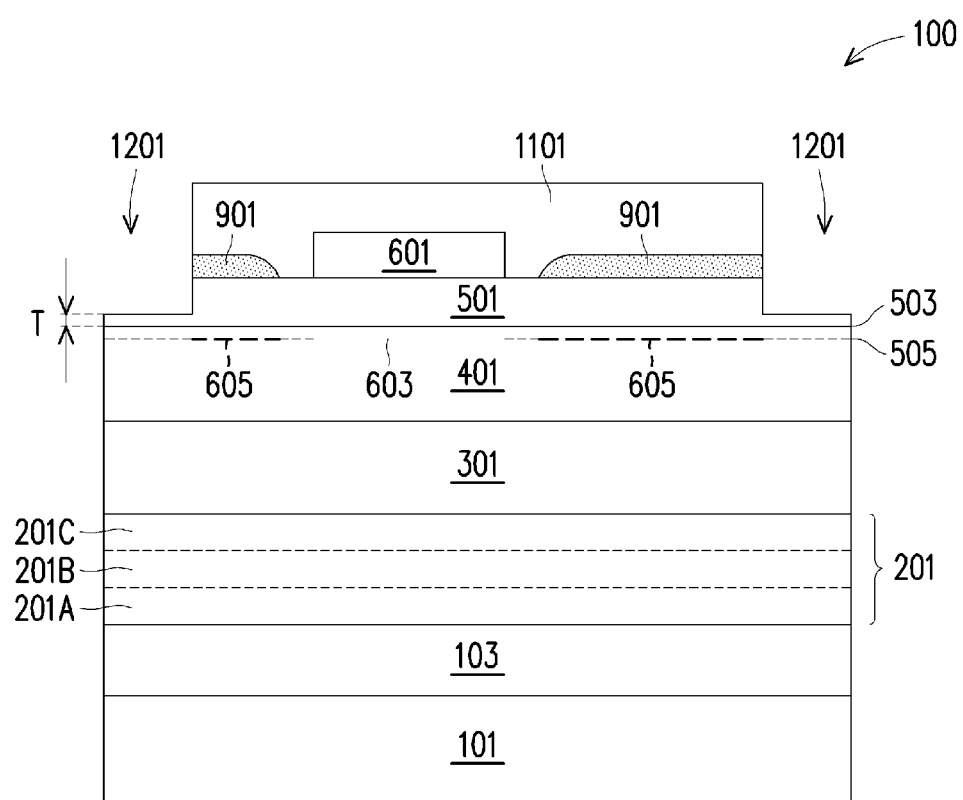

Referring to FIG. 12, the passivation layer 1101 and the III-V compound layers 501 and 901 are patterned to form openings 1201. The openings 1201 extend through the passivation layer 1101 and the III-V compound layer 901, and into the III-V compound layer 501, such that portions of the III-V compound layer 501 having a thickness T remain directly below the openings 1201. In some embodiments, the thickness T is between about 2 nm and about 4 nm. In some embodiments, the passivation layer 1101 and the III-V compound layers 501 and 901 are patterned using a suitable photolithography and etching processes. The suitable etching process may include one or more wet etching processes, one or more dry etching processes, a combination thereof, or the like. In other embodiments, the patterning process may pattern only the passivation layer 1101, such that the openings 1201 expose the topmost surface of the III-V compound layer 901. In yet other embodiments, the patterning process may pattern the passivation layer 1101 and the III-V compound layers 501 and 901, such that the openings 1201 expose the topmost surface of the III-V compound layer 401.

Figure 13:
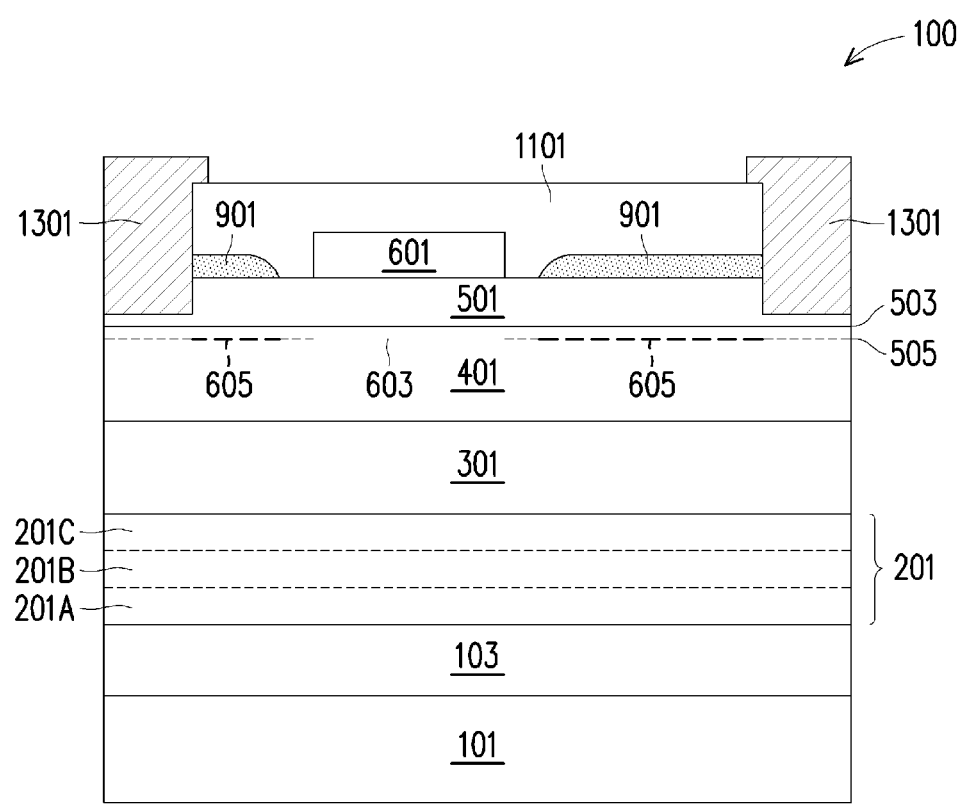

Referring to FIG. 13, source/drain electrodes 1301 are formed in the openings 1201 (see FIG. 12). In some embodiments, the source/drain electrodes 1301 are formed by a deposition process followed by lithography and etching processes. In other embodiments, the source/drain electrodes 1301 are formed by forming a patterned sacrificial layer (such as, for example, a photoresist layer) over the passivation layer 1101, such that openings in the patterned sacrificial layer are aligned with respective ones of the openings 1201, followed by a deposition process and a lift-off process to remove the patterned sacrificial layer.

In some embodiments, the source/drain electrodes 1301 include one or more conductive materials. For example, the source/drain electrodes 1301 may comprise Ti, Co, Ni, W, Pt, Ta, Pd, Mo, TiN, an AlCu alloy, alloys thereof, or the like. In some embodiments, each of the source/drain electrodes 1301 includes a bottom Ti/TiN layer, an AlCu layer overlying the bottom Ti/TiN layer, and a top Ti layer overlying the AlCu layer. The formation methods of the one or more conductive materials include ALD, physical vapor deposition (PVD), electrochemical plating, electroless plating, a combination thereof, or the like. In some embodiments, a thermal annealing process is applied to the source/drain electrodes 1301 to react with the III-V compound layers 501 and 901 to form an inter-metallic compound (not shown) at interfaces between the source/drain electrodes 1301 and the III-V compound layers 501 and 901. The inter-metallic compound may provide more effective electrical connection to the access regions 605 of the channel layer 505.

Figure 14:
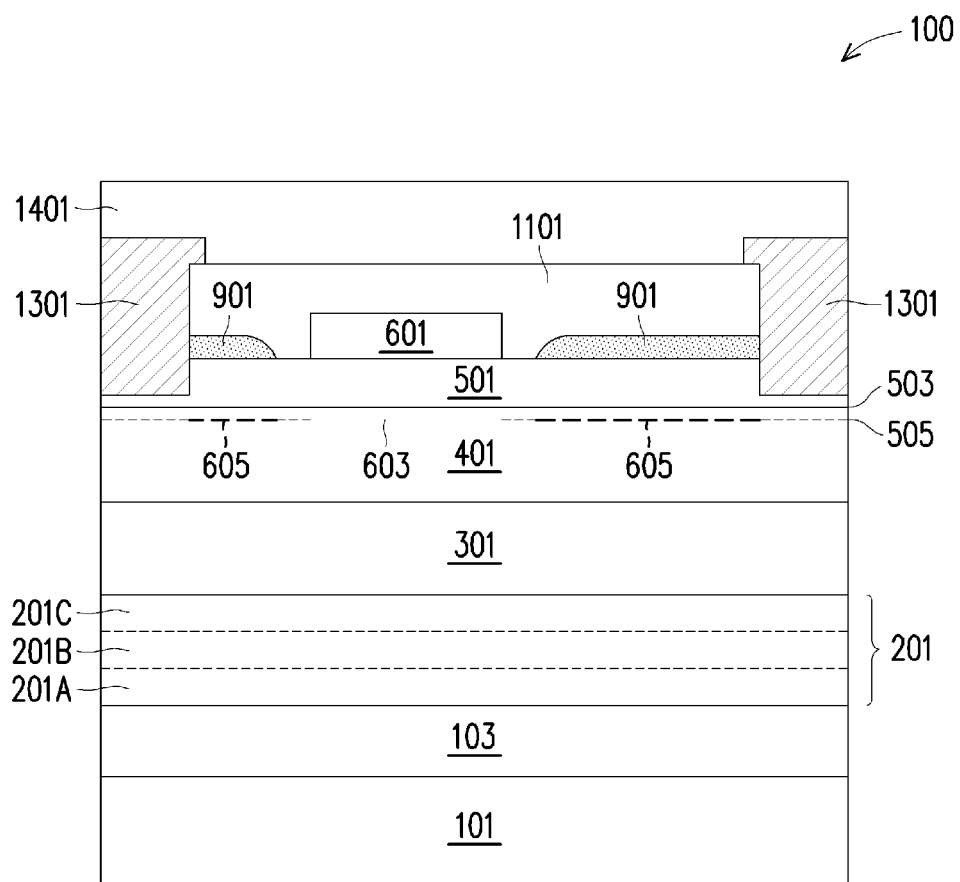

Referring to FIG. 14, a passivation layer 1401 is formed over the passivation layer 1101 and the source/drain electrodes 1301. In some embodiments, the passivation layer 1401 may be formed using similar materials and methods as the passivation layer 701 described above with reference to FIG. 7, and the description is not repeated herein. In some embodiments, the passivation layers 1101 and 1401 comprise a same material. In such embodiments, an interface between the passivation layers 1101 and 1401 may not be detectable. In other embodiments, the passivation layers 1101 and 1401 comprise different materials. In some embodiments, the passivation layer 1401 has a thickness between about 1 µm and about 20 µm.

Figure 15:
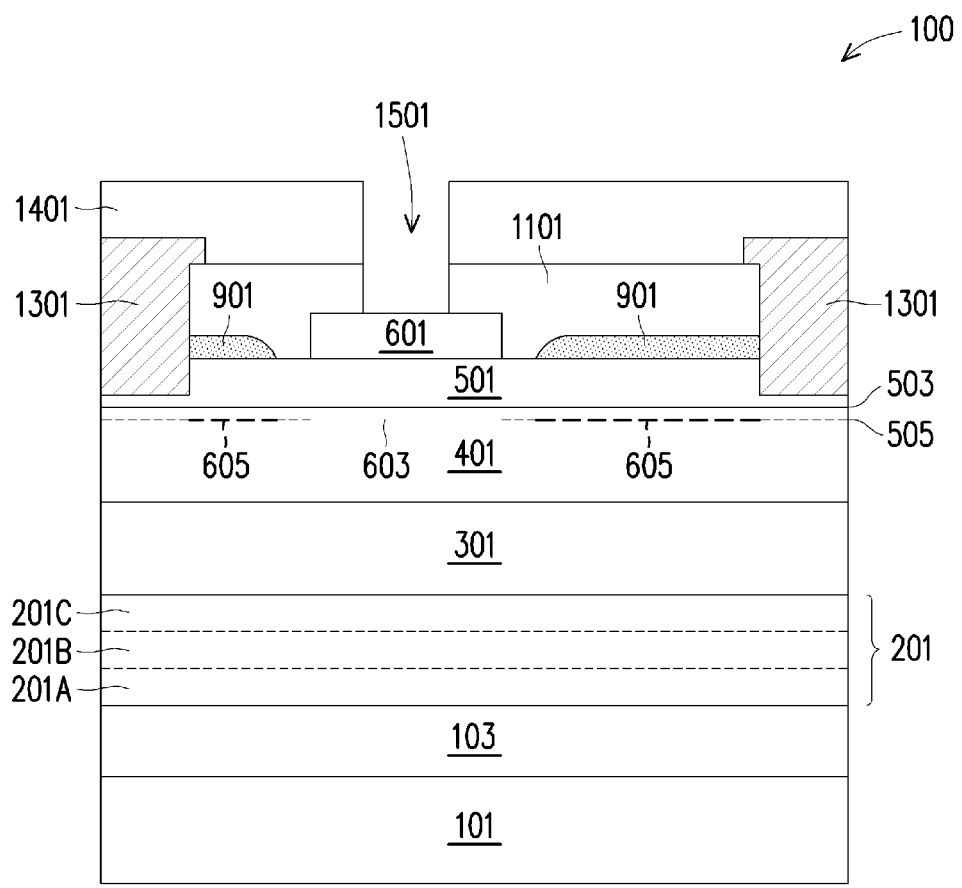

Referring to FIG. 15, the passivation layers 1101 and 1401 are patterned to form an opening 1501. The opening 1501 exposes a topmost surface of the III-V compound layer 601. In some embodiments, the passivation layers 1101 and 1401 are patterned using a suitable photolithography and etching processes. The suitable etching process may include one or more wet etching processes, one or more dry etching processes, a combination thereof, or the like.

Figure 16:
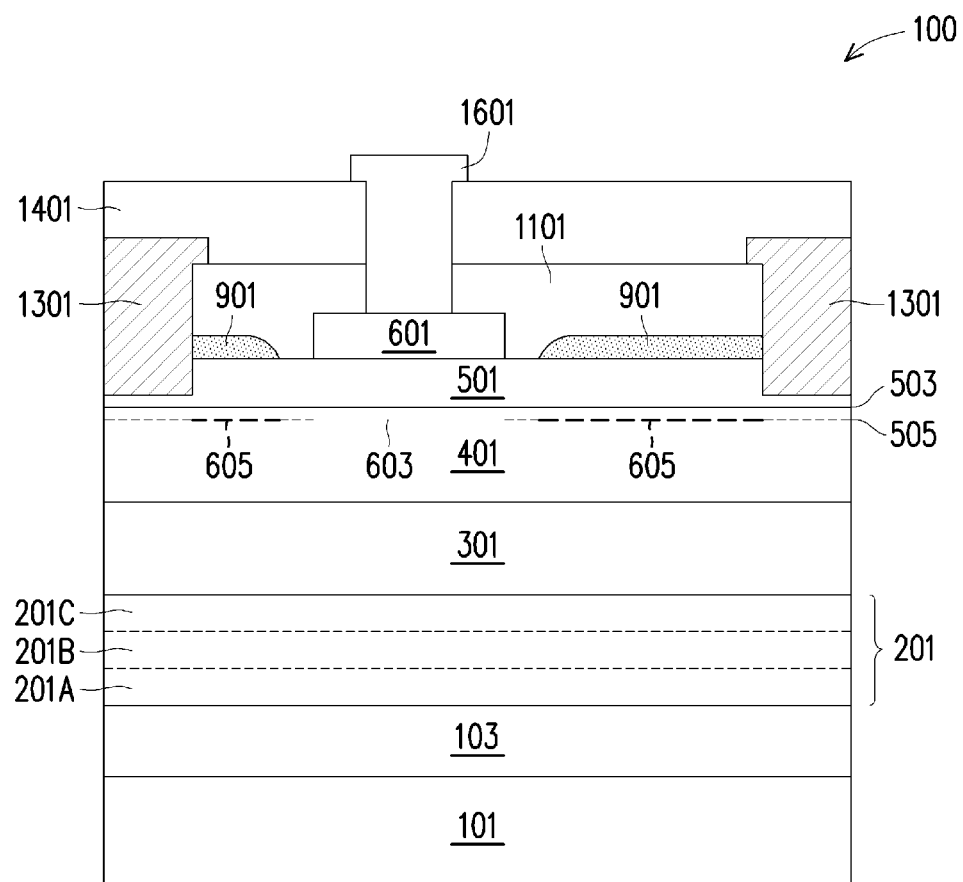

Referring to FIG. 16, a gate electrode 1601 is formed in the opening 1501 (see FIG. 15) over the III-V compound layer 601. In some embodiments, the gate electrode 1601 is formed by a deposition process followed by lithography and etching processes. In other embodiments, the gate electrode 1601 is formed by forming a patterned sacrificial layer (such as, for example, a photoresist layer) over the passivation layer 1401, such that an opening in the patterned sacrificial layer is aligned with the opening 1501, followed by a deposition process and a lift-off process to remove the patterned sacrificial layer.

In some embodiments, the gate electrode 1601 includes one or more conductive materials. In some embodiments, the gate electrode 1601 is formed of tantalum or titanium containing materials such as TaC, TaN, TiN, TaAlN, TaSiN, TaCN, a combination thereof, or the like. These metal-containing materials may be in the form of metal carbides, metal nitrides, or conductive metal oxides. Other embodiments may utilize other types of metals, such as W, Ni, Au, Cu, Ta, Ti, Ag, Al, TiAl, Mn, WN, Ru, Zr, a combination thereof, or the like. The formation methods of the gate electrode 1601 include ALD, PVD, MOCVD, a combination thereof, or the like. The gate electrode 1601 may further include two or more layers for a composite gate structure. Although FIG. 16 illustrate the gate electrode 1601 being formed directly on the topmost surface of the III-V compound layer 601, various intermediary layers (such as, for example, a gate dielectric, interfacial layers, work/function metals, or the like) may be formed between the gate electrode 1601 and the III-V compound layer 601.

Figure 17:
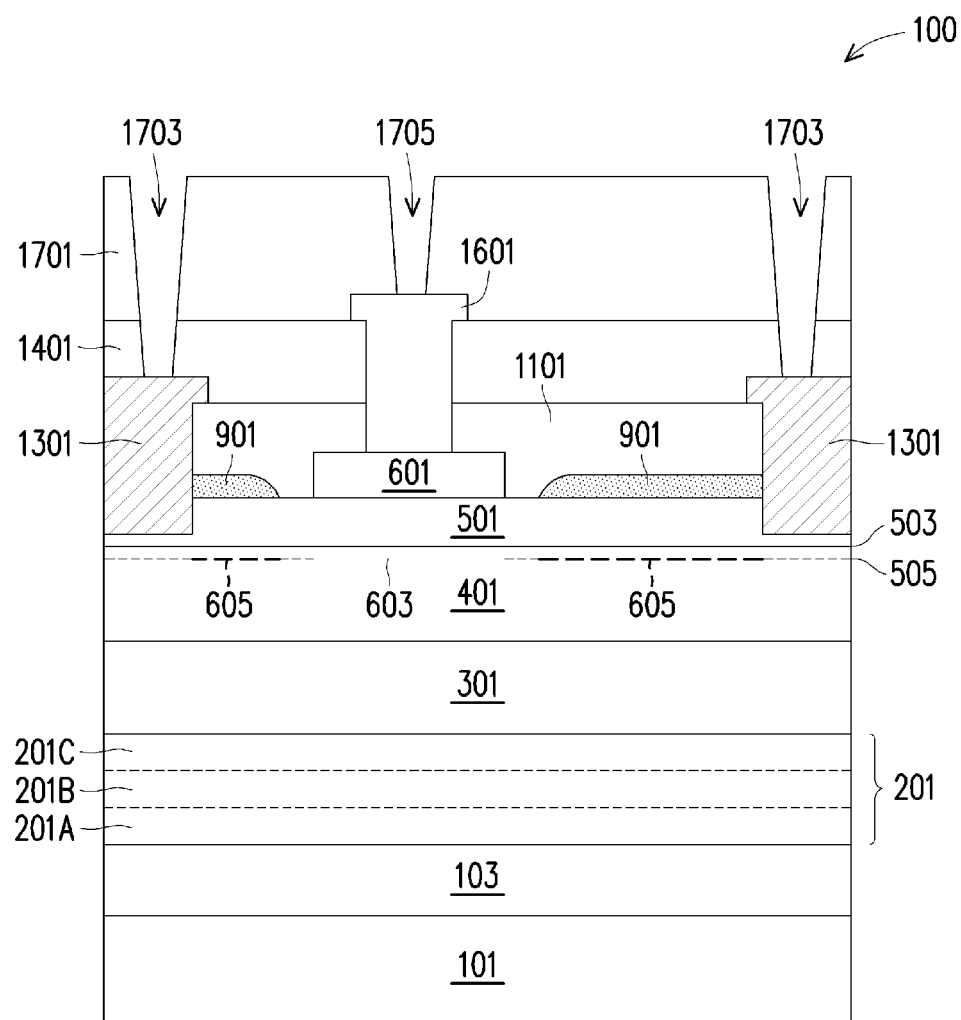

Referring to FIG. 17, an interlayer dielectric (ILD) 1701 is formed over the gate electrode 1601 and the passivation layer 1401. In some embodiments, the ILD 1701 is formed of a dielectric material, such as Phospho-Silicate Glass (PSG), Boro-Silicate Glass (BSG), Boron-Doped Phospho-Silicate Glass (BPSG), undoped Silicate Glass (USG), a combination thereof, or the like, and may be deposited by any suitable method, such as CVD, plasma enhanced CVD (PECVD), a spin-on-glass process, a combination thereof, or the like. In some embodiments, a planarization process, such as a chemical mechanical polishing (CMP) process, may be performed to planarize a topmost surface of the ILD 1701.

In some embodiments, the ILD 1701 and the passivation layer 1401 are patterned to form openings 1703 and 1705. In some embodiments, the ILD 1701 and the passivation layer 1401 are patterned using a suitable photolithography and etching processes. The suitable etching process may include one or more wet etching processes, one or more dry etching processes, a combination thereof, or the like. The openings 1703 and 1705 may all be formed simultaneously in a same process, or in separate processes. The openings 1703 extend through the ILD 1701 and the passivation layer 1401 and expose topmost surfaces of the source/drain electrodes 1301. The opening 1705 extends through the ILD 1701 and exposes a topmost surface of the gate electrode 1601.

Figure 18:
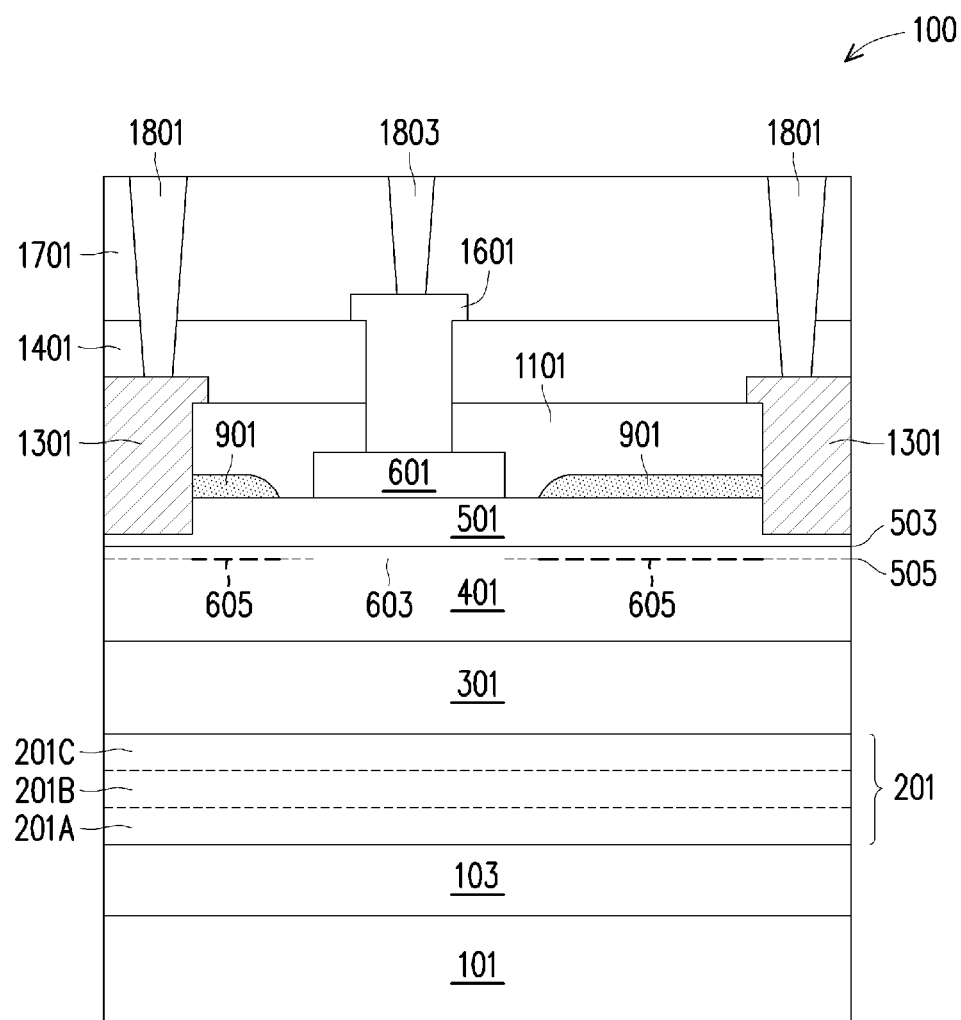

Referring to FIG. 18, contact plugs 1801 are formed in the openings 1703 (see FIG. 17) and a contact plug 1803 is formed in the opening 1705 (see FIG. 17). In some embodiments, a liner, such as a diffusion barrier layer, an adhesion layer, or the like, and a conductive material are deposited in the openings 1703 and 1705. The liner may include titanium, titanium nitride, tantalum, tantalum nitride, a combination thereof, or the like. Subsequently, the openings 1703 and 1705 are filled with a conductive material. The conductive material may be copper, a copper alloy, silver, gold, tungsten, aluminum, nickel, a combination thereof, or the like. A planarization process, such as a CMP process, may be performed to remove excess materials from a top surface of the ILD 1701. The remaining portions of the liner and the conductive material form the contact plugs 1801 and 1803. The contact plugs 1801 are physically and electrically coupled to the source/drain electrodes 1301 and the contact plug 1803 is physically and electrically coupled to the gate electrode 1601. While the contact plugs 1801 are depicted in FIG. 18 in a same cross-section as the contact plug 1803, this depiction is for the purposes of illustration only and, in other embodiments, the contact plugs 1801 may be disposed in a different cross-section than the contact plug 1803.

Figure 19:
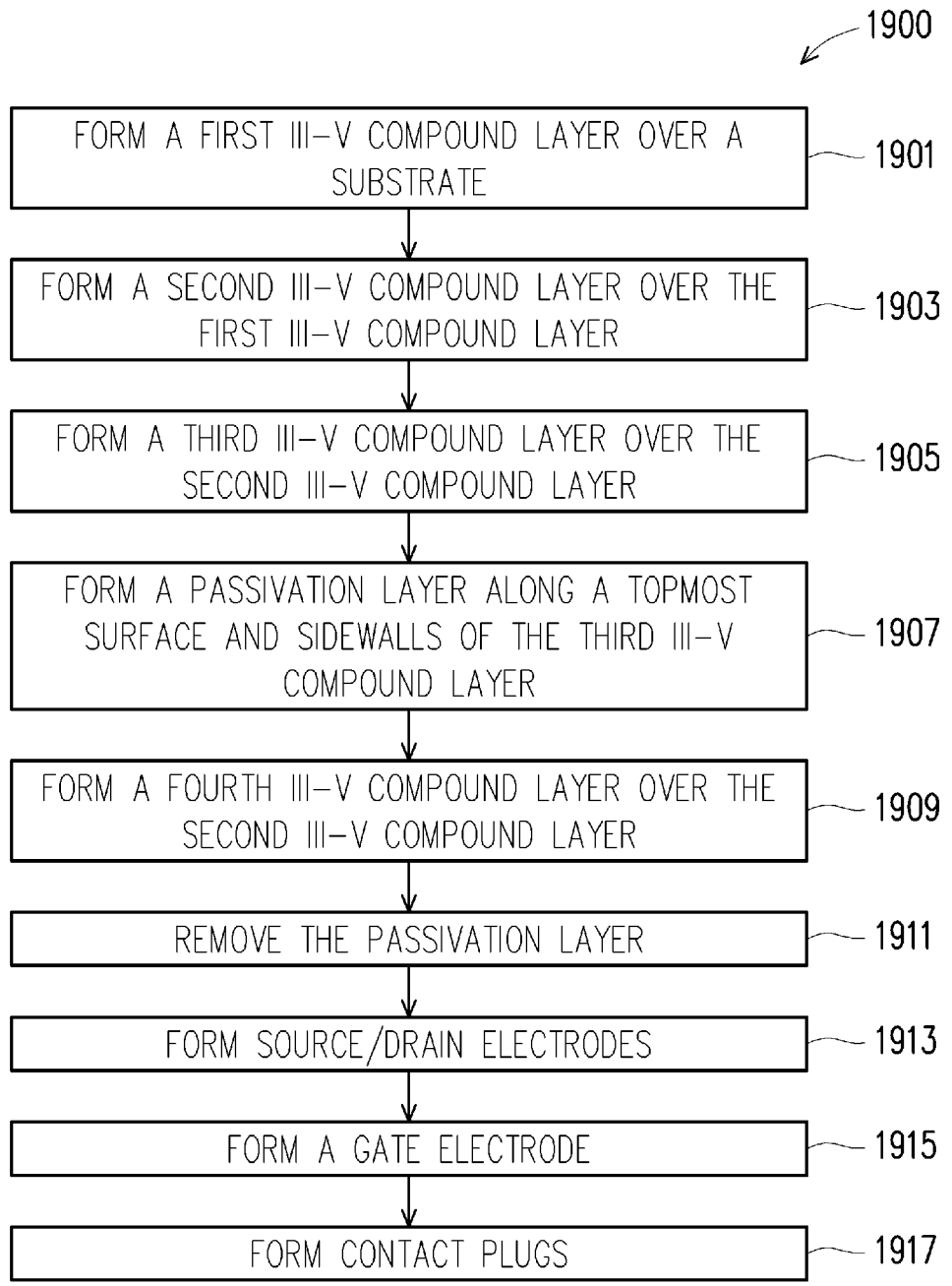
FIG. 19 is a flow diagram illustrating a method of forming a HEMT device in accordance with some embodiments.

FIG. 19 is a flow diagram illustrating a method 1900 of forming a HEMT device in accordance with some embodiments. The method 1900 starts with step 1901, where a first III-V compound layer (such as, for example, the III-V compound layer 401 illustrated in FIG. 4) is formed over a substrate (such as, for example, the substrate 101 illustrated in FIG. 4) as described above with reference to FIG. 4. In step 1903, a second III-V compound layer (such as, for example, the III-V compound layer 501 illustrated in FIG. 5) is formed over the first III-V compound layer as described above with reference to FIG. 5. In step 1905, a third III-V compound layer (such as, for example, the III-V compound layer 601 illustrated in FIG. 6B) is formed over the second III-V compound layer as described above with reference to FIGS. 6A and 6B. In step 1907, a passivation layer (such as, for example, the passivation layer 701 illustrated in FIG. 8) is formed over a topmost surface and sidewalls of the third III-V compound layer as described above with reference to FIGS. 7 and 8. In step 1909, a fourth III-V compound layer (such as, for example, the III-V compound layer 901 illustrated in FIG. 9) is formed over the second III-V compound layer as described above with reference to FIG. 9. In step 1911, the passivation layer is removed as described above with reference to FIG. 10. In step 1913, source/drain electrodes (such as, for example, the source/drain electrodes 1301 illustrated in FIG. 13) are formed as described above with reference to FIGS. 11-13. In step 1915, a gate electrode (such as, for example, the gate electrode 1601 illustrated in FIG. 16) is formed as described above with reference to FIGS. 14-16. In step 1917, contact plugs (such as, for example, the contact plugs 1801 and 1803 illustrated in FIG. 18) are formed as described above with reference to FIGS. 17 and 18.

In accordance with an embodiment, a method includes forming a first III-V compound layer over a substrate. A second III-V compound layer is formed over the first III-V compound layer. The second III-V compound layer has a greater band gap than the first III-V compound layer. A third III-V compound layer is formed over the second III-V compound layer. The third III-V compound layer and the first III-V compound layer comprise a same III-V compound. A passivation layer is formed along a topmost surface and sidewalls of the third III-V compound layer. A fourth III-V compound layer is formed over the second III-V compound layer. The fourth III-V compound layer has a greater band gap than the first III-V compound layer. In an embodiment, forming the passivation layer includes blanket depositing a dielectric material over the second III-V compound layer and the third III-V compound layer, and patterning the dielectric material to expose a topmost surface of the second III-V compound layer. A remaining portion of the dielectric material forms the passivation layer. In an embodiment, the third III-V compound layer is a p-doped layer. In an embodiment, forming the fourth III-V compound layer includes: introducing the substrate into a process chamber; ramping up a process temperature to a target temperature; and after ramping up the process temperature to the target temperature, introducing precursors into the process chamber. In an embodiment, the target temperature is between about 700° C. and about 950° C. In an embodiment, the second III-V compound layer is not intentionally doped. In an embodiment, forming the fourth III-V compound layer over the second III-V compound layer includes selectively epitaxially growing the fourth III-V compound layer over the second III-V compound layer.

In accordance with another embodiment, a method includes forming a GaN layer over a substrate. A first AlGaN layer is formed over the GaN layer. A p-doped GaN layer is formed over the first AlGaN layer. A dielectric material is blanket deposited over the p-doped GaN layer and the first AlGaN layer. A portion of the dielectric material is removed from over a topmost surface of the first AlGaN layer. A remaining portion of the dielectric material extending along a topmost surface and sidewalls of the p-doped GaN layer forms a passivation layer. A second AlGaN layer is formed over the first AlGaN layer. The second AlGaN layer has a greater aluminum content than the first AlGaN layer. In an embodiment, forming the second AlGaN layer includes: introducing the substrate into a process chamber; ramping up a process temperature to a target temperature; and after ramping up the process temperature to the target temperature, introducing an aluminum precursor, a gallium precursor and a nitrogen precursor into the process chamber. In an embodiment, the target temperature is between about 700° C. and about 950° C. In an embodiment, the p-doped GaN layer is in situ doped. In an embodiment, the first AlGaN layer includes $Al_xGa_{1-x}N$, the second AlGaN layer includes $Al_yGa_{1-y}N$, and a ratio y/x is between about 1.1 and about 2.5. In an embodiment, the GaN layer is not intentionally doped. In an embodiment, the method further includes, after forming the second AlGaN layer, removing the passivation layer.

In accordance with yet another embodiment, a device includes a substrate, a GaN layer over the substrate, a first AlGaN layer over the GaN layer, and a p-doped GaN layer over the first AlGaN layer. A width of the p-doped GaN layer is less than a width of the first AlGaN layer. The device further includes a second AlGaN layer over the first AlGaN layer. The second AlGaN layer has a greater aluminum content than the first AlGaN layer. In an embodiment, the first AlGaN layer includes $Al_xGa_{1-x}N$, the second AlGaN layer includes $Al_yGa_{1-y}N$, and a ratio y/x is between about 1.1 and about 2.5. In an embodiment, the GaN layer is an un-doped layer. In an embodiment, the device further includes a passivation layer over the p-doped GaN layer and the second AlGaN layer. The passivation layer extends along a sidewall of the p-doped GaN layer and a sidewall of the second AlGaN layer. In an embodiment, the device further includes a gate electrode extending through the passivation layer and physically contacting a topmost surface of the p-doped GaN layer. In an embodiment, the device further includes a graded AlGaN buffer layer between the substrate and the GaN layer.

In accordance with yet another embodiment, a device includes a substrate, a first III-V compound layer over the substrate, a second III-V compound layer over the first III-V compound layer, a third III-V compound layer over the second III-V compound layer, a fourth III-V compound layer over the second III-V compound layer, and a passivation layer over the third III-V compound layer and the fourth III-V compound layer. The second III-V compound layer has a greater band gap than the first III-V compound layer. The third III-V compound layer and the first III-V compound layer include a same III-V compound. The fourth III-V compound layer has a greater band gap than the first III-V compound layer. A portion of the passivation layer extends between the third III-V compound layer and the fourth III-V compound layer, and is in physical contact with the second III-V compound layer. In an embodiment, the device further includes a source/drain electrode extending through the passivation layer, the fourth III-V compound layer, and into the second III-V compound layer. In an embodiment, the device further includes a gate electrode extending through the passivation layer and being in physical contact with the third III-V compound layer. In an embodiment, the first III-V compound layer includes GaN. In an embodiment, the second III-V compound layer includes AlGaN. In an embodiment, the third III-V compound layer includes p-doped GaN. In an embodiment, the fourth III-V compound layer includes AlGaN.

In accordance with yet another embodiment, a device includes a first semiconductor layer over a substrate, a second semiconductor layer over the first semiconductor layer, a third semiconductor layer over the second semiconductor layer, a fourth semiconductor layer over the second semiconductor layer, a passivation layer over the third semiconductor layer and the fourth semiconductor layer, and a source/drain electrode extending through the passivation layer, the fourth semiconductor layer, and into the second semiconductor layer. The first semiconductor layer includes a first III-V compound. The second semiconductor layer includes a second III-V compound different from the first III-V compound. The third semiconductor layer includes a p-doped first III-V compound. The third semiconductor layer is interposed between two disconnected portions of the fourth semiconductor layer. The fourth semiconductor layer includes a third III-V compound. A bottom surface of the passivation layer is lower than a top surface of the third semiconductor layer and a top surface of the fourth semiconductor layer. In an embodiment, the first III-V compound includes GaN. In an embodiment, the second III-V compound and the third III-V compound include AlGaN. In an embodiment, the device further includes a gate electrode extending through the passivation layer and being in physical contact with the third semiconductor layer. In an embodiment, a top surface of the gate electrode is above a top surface of the source/drain electrode. In an embodiment, the passivation layer is in physical contact with the second semiconductor layer. In an embodiment, a top surface of the source/drain electrode is above a top surface of the passivation layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a substrate;
   a first III-V compound layer over the substrate;
   a second III-V compound layer over the first III-V compound layer, the second III-V compound layer having a greater band gap than the first III-V compound layer;
   a third III-V compound layer over the second III-V compound layer, the third III-V compound layer and the first III-V compound layer comprising a same III-V compound;
   a fourth III-V compound layer over the second III-V compound layer, a bottom surface of the third III-V compound layer and a bottom surface of the fourth III-V compound layer being in physical contact with a top surface of the second III-V compound layer, the fourth III-V compound layer having a greater band gap than the first III-V compound layer; and
   a passivation layer over the third III-V compound layer and the fourth III-V compound layer, a portion of the passivation layer extending between the third III-V compound layer and the fourth III-V compound layer, and being in physical contact with the second III-V compound layer.

2. The device of claim 1, further comprising a source/drain electrode extending through the passivation layer, the fourth III-V compound layer, and into the second III-V compound layer.

3. The device of claim 1, further comprising a gate electrode extending through the passivation layer and being in physical contact with the third III-V compound layer.

4. The device of claim 1, wherein the first III-V compound layer comprises GaN.

5. The device of claim 1, wherein the second III-V compound layer comprises AlGaN.

6. The device of claim 1, wherein the third III-V compound layer comprises p-doped GaN.

7. The device of claim 1, wherein the fourth III-V compound layer comprises AlGaN.

8. A device comprising:
   a first semiconductor layer over a substrate, the first semiconductor layer comprising a first III-V compound;
   a second semiconductor layer over the first semiconductor layer, the second semiconductor layer comprising a second III-V compound different from the first III-V compound;
   a third semiconductor layer over the second semiconductor layer, the third semiconductor layer comprising a p-doped first III-V compound;
   a fourth semiconductor layer over the second semiconductor layer, the third semiconductor layer being interposed between two disconnected portions of the fourth semiconductor layer, the third semiconductor layer being spaced apart from the two disconnected portions of the fourth semiconductor layer, the fourth semiconductor layer comprising a third III-V compound;
   a passivation layer over the third semiconductor layer and the fourth semiconductor layer, a bottom surface of the passivation layer being lower than a top surface of the third semiconductor layer and a top surface of the fourth semiconductor layer; and
   a source/drain electrode extending through the passivation layer, the fourth semiconductor layer, and into the second semiconductor layer.

9. The device of claim 8, wherein the first III-V compound comprises GaN.

10. The device of claim 8, wherein the second III-V compound and the third III-V compound comprise AlGaN.

11. The device of claim 8, further comprising a gate electrode extending through the passivation layer and being in physical contact with the third semiconductor layer.

12. The device of claim 11, wherein a top surface of the gate electrode is above a top surface of the source/drain electrode.

13. The device of claim 8, wherein the passivation layer is in physical contact with the second semiconductor layer.

14. The device of claim 8, wherein a top surface of the source/drain electrode is above a top surface of the passivation layer.

15. A device comprising:
   a substrate;
   a first GaN layer over the substrate;
   a first AlGaN layer over the first GaN layer;
   a p-doped second GaN layer over the first AlGaN layer, a width of the p-doped second GaN layer being less than a width of the first AlGaN layer; and
   a second AlGaN layer over the first AlGaN layer, the second AlGaN layer having a greater aluminum content than the first AlGaN layer, wherein a sidewall of the p-doped second GaN layer faces a sidewall of the second AlGaN layer.

16. The device of claim 15, wherein the first AlGaN layer comprises $Al_xGa_{1-x}N$, wherein the second AlGaN layer comprises $Al_yGa_{1-y}N$, and wherein a ratio y/x is between about 1.1 and about 2.5.

17. The device of claim 15, wherein the first GaN layer is an un-doped layer.

18. The device of claim 15, further comprising a passivation layer over the p-doped second GaN layer and the second AlGaN layer, the passivation layer extending along the sidewall of the p-doped second GaN layer and the sidewall of the second AlGaN layer.

19. The device of claim 18, further comprising a gate electrode extending through the passivation layer and physically contacting a topmost surface of the p-doped second GaN layer.

20. The device of claim 15, further comprising a graded AlGaN buffer layer between the substrate and the first GaN layer.

* * * * *